(12) United States Patent  (10) Patent No.: US 7,888,779 B2
Jiang et al.  (45) Date of Patent: Feb. 15, 2011

(54) METHOD OF FABRICATION INGAAIN FILM AND LIGHT-EMITTING DEVICE ON A SILICON SUBSTRATE

(75) Inventors: Fengyi Jiang, Nanchang (CN); Wenqing Fang, Nanchang (CN); Li Wang, Nanchang (CN); Chunlan Mo, Nanchang (CN); Hechu Liu, Nanchang (CN); Maoxing Zhou, Nanchang (CH)

(73) Assignee: Lattice Power (Jiangxi) Corporation, Nanchang (CN)

( * ) Notice: Subject to any disclaimer, the term of this patent is extended or adjusted under 35 U.S.C. 154(b) by 531 days.

(21) Appl. No.: 11/910,735

(22) PCT Filed: Apr. 14, 2006

(86) PCT No.: PCT/CN2006/000681
§ 371 (c)(1),
(2), (4) Date: Apr. 23, 2008

(87) PCT Pub. No.: WO2006/108359
PCT Pub. Date: Oct. 19, 2006

(65) Prior Publication Data
US 2009/0050927 A1    Feb. 26, 2009

(30) Foreign Application Priority Data
Apr. 15, 2005  (CN) .................. 2005 1 0025179

(51) Int. Cl.
*H01L 29/06* (2006.01)
*H01L 21/203* (2006.01)

(52) U.S. Cl. .............. 257/626; 257/622; 257/E21.085; 257/E21.098; 257/E33.033; 257/E33.043; 438/41; 438/44

(58) Field of Classification Search .......... 257/103, 257/466, 622, 623, 626, E21.085, E21.098, 257/E33.033, E33.043; 438/39, 41, 42, 44, 438/33, 114
See application file for complete search history.

(56) References Cited

U.S. PATENT DOCUMENTS 6,500,257 B1 * 12/2002 Wang et al. .................... 117/95
2005/0151153 A1 * 7/2005 Kamikawa et al. .......... 257/103

FOREIGN PATENT DOCUMENTS

JP            11274559 A  * 10/1999

* cited by examiner

*Primary Examiner*—David Vu
*Assistant Examiner*—Earl N Taylor
(74) *Attorney, Agent, or Firm*—Park, Vaughan, Fleming & Dowler LLP; Shun Yao

(57) ABSTRACT

There is provided a method of fabricating InGaAlN film on a silicon substrate, which comprises the following steps of forming a pattern structured having grooves and mesas on the silicon substrate, and depositing InGaAlN film on the surface of substrate, wherein the depth of the grooves is more than 6 nm, and the InGaAlN film formed on the mesas of both sides of the grooves are disconnected in the horizontal direction. The method may grow high quality, no crack and large area of InGaAlN film by simply treating the substrate. At the same time, there is also provided a method of fabricating InGaAlN light-emitting device by using the silicon substrate.

24 Claims, 3 Drawing Sheets

METHOD OF FABRICATION INGAAIN FILM AND LIGHT-EMITTING DEVICE ON A SILICON SUBSTRATE

RELATED APPLICATION

This application is a national-stage application of and hereby claims priority under 35 U.S.C. §371 to the PCT Application No PCT/CN2006/000681, filed 14 Apr. 2006, which claims priority to China Patent Application No. 200510025179.7, filed 15 Apr. 2005.

TECHNOLOGY FIELD

The present invention relates to a semiconductor material, and, more specifically, to a method for fabricating InGaAlN films and light-emitting devices on a silicon substrate.

BACKGROUND TECHNOLOGY $In_xGa_yAl_{1-x-y}N$ ($0<=x<=1$, $0<=y<=1$) is one of the materials of choice for fabricating short wavelength light-emitting devices. In recent years, researchers worldwide have developed many novel InGaAlN-based light-emitting devices, such as blue, green, and white light-emitting diodes (LEDs) and violet semiconductor lasers. Meanwhile, InGaAlN is also a good material for manufacturing high-performance electronic devices.

Among exiting technologies, methods for fabricating InGaAlN materials on sapphire and SiC substrates are known to the public. For example, Japanese patent JP2737053 disclosed a method for fabricating GaN materials on a sapphire substrate; and U.S. Pat. No. 5,686,738 disclosed a method for fabricating GaN materials on a SiC substrate. Based on these publicly available technologies, one can fabricate high-quality InGaAlN materials. However, since SiC substrates are very expensive, using SiC substrates to fabricate InGaAlN can incur high costs. Sapphire is also costly. Furthermore, sapphire is an insulator and is difficult to process. An InGaAlN device fabricated on a sapphire substrate cannot have a vertical electrode configuration. As a result, fabricating InGaAlN devices on a sapphire substrate can be complex and costly. Silicon, being a mature semiconductor material, is not only cheap, but also easy to control in terms of conduction type and resistivity. Moreover, techniques for processing silicon are fairly mature. Using silicon to fabricate InGaAlN materials can significantly reduce the associated costs. However, silicon and InGaAlN materials exhibit considerable lattice mismatch and thermal mismatch. Consequently, InGaAlN materials fabricated on silicon are prone cracking and cannot be used to fabricate high-performance light-emitting or electronic devices. Paper (Phys. stat. sol. (a) 188, 155 (2001)) provided a method for using SiN patterning and masking on a substrate, which can reduce the amount of cracking. However, this method is unsuitable for volume production due to its complexity. Paper (Appl. Phys. Lett. 78, 288 (2001)) provided a method for lateral confined epitaxy, which improves stress relief by forming grooves. However, this paper concluded that the crack-free area of a 0.7 μm thick GaN material grown on a (111) silicon substrate cannot exceed 14.3 μm. A typical light-emitting device requires a device area greater than 100×100 μm² due to the need for fabricating ohmic electrodes. Therefore, the methods disclosed by these published papers cannot be used to fabricate efficient light-emitting devices.

CONTENTS OF INVENTION

One objective of the present invention is to provide a method for fabricating a crack-free InGaAlN film on a silicon substrate.

A further objective of the present invention is to provide a method for fabricating an InGaAlN light-emitting device.

These and other objectives of the present invention are described in the following detailed explanation.

A method for fabricating InGaAlN ($In_xGa_yAl_{1-x-y}N$, $0<=x<=1$, $0<=y<=1$) film on a silicon substrate in accordance with the present invention includes the following steps:

A. Forming on the surface of the silicon substrate a pattern which includes grooves and mesas;

B. Depositing InGaAlN film on the surface of the silicon substrate; wherein said the depth of said grooves is greater than or equal to 6 μm, and the InGaAlN films grown on two mesas on the two sides of a groove are disjoint.

Furthermore, according to one method for fabricating InGaAlN film on a (111) silicon substrate in the present invention, the depth of the grooves is 6-300 μm, preferably 10-30 μm. The width of a groove is greater than the width of laterally grown films on the mesas on the two sides of the groove. Preferably, the width of a groove is 6-50 μm. The depth of a groove can be greater than twice the thickness of the film. On the substrate, the grooves appear as lines and can exhibit a cross-hatched pattern. The grooves can intersect or connect with one another, exhibit a radial pattern, or do not intersect one another.

According to one method for fabricating InGaAlN film on a silicon substrate in the present invention, in the substrate pattern, the ratio of the perimeter to the area of a disjoint, independent mesa is greater than 1 mm/mm² and less than 40 mm/mm², preferable grater than 4 mm/mm² and less than 20 mm/mm². Said pattern can include a circle, triangle, rectangle, square, polygon, or other irregular patterns. The area of said mesa is greater an 100×100 μm² and less than 3000×3000 μm², preferably greater than 200×200 μm² and less than 1000×1000 μm².

One method for fabricating InGaAlN ($In_xGa_yAl_{1-x-y}N$, $0<=x<=1$, $0<=y<=1$) light-emitting device in the present invention includes the above described method for manufacturing InGaAlN film. Furthermore, it also includes fabricating P-type and N-type electrodes on the surface of said InGaAlN film or the backside of the substrate, and then dicing the substrate along the grooves, thereby allowing each mesa to form a respective light-emitting device.

In the present invention, multiple light-emitting devices can be simultaneously and independently formed on the same silicon substrate.

A method for fabricating InGaAlN ($In_xGa_yAl_{1-x-y}N$, $0<=x<=1$, $0<=y<=1$) light-emitting device on a silicon substrate in accordance with the present invention includes the following steps:

A. Forming on the surface of the silicon substrate grooves of which the depth is greater than or equal to 6 μm, thereby dividing the substrate surface into a number of mesas whose area is greater than 100×100 μm² and less than 3000×3000 μm²;

B. Depositing multi-layer InGaAlN film on the surface of the silicon substrate;

C. Forming P-type and N-type electrodes on the surface of said InGaAlN film or the backside of the substrate;

D. Dicing the substrate along said grooves to allow each mesa to form a respective light-emitting device.

Using the methods in the present invention, one can fabricate high-performance, crack-free, and large-area InGaAlN film by simply pre-processing the substrate, which facilitates high-volume production of high-performance light-emitting devices.

In the present invention, because there is significant lattice mismatch and thermal mismatch between silicon and InGaAlN material, InGaAlN materials fabricated on a large silicon substrate may crack after the InGaAlN film reaches a certain thickness due to accumulated stress. The present invention reduces the stress imposed on the InGaAlN film by forming on the substrate a number of grooves with sufficient density, depth, and width. Since the substrate surface is divided into multiple sections, the InGaAlN material grown in each section is disjoint from one another in space. As a result, the amount of freed surface is increased, and the stress is reduced. On the other hand, the grooves must be sufficiently deep to change the stress distribution between the InGaAlN epitaxial film and the substrate. When the grooves are sufficiently deep, the silicon mesas can undertake more stress, which reduces the stress imposed on the InGaAlN film grown on the mesas and prevents the film from cracking. Since the thickness of an InGaAlN film for an LED is typically greater than 3 μm, methods in the present invention require the groove depth to be greater than 6 μm.

In the present invention, the grooves on the substrate appear as lines and form different patterns. Ideally, these patterns can reduce the stress and render the light-emitting materials usable. The grooves can intersect or connect with one another. They can form a circle, triangle, rectangle, square, polygon, or other irregular shapes. The grooves can form radial patterns or any patterns where the grooves do not intersect with one another. Generally, the intersecting grooves divide the substrate into many sections of a certain shape. The section shape can be square, rectangular, triangular, or of any commonly observed regular shapes. One embodiment chooses the square shape to facilitate device fabrication. The grooves can be formed using any mature etching methods, such as dry etching, wet etching, mechanical dicing, etc. Since the film at the edge of a mesa tend to grow laterally and extends outside the mesa, the groove width must be greater than the thickness of the film grown laterally to prevent the films on neighboring mesas from being connected due to the lateral growth. Preferably, the groove width is greater than twice the film thickness. To effectively release stress, the number or length of the grooves may vary based on the substrate area. The condition of choice in the present inventive method is that the groove density is sufficiently high so that ratio of the perimeter to the area of any independent mesa is greater than 1 mm/mm$^2$. However, in order to form ohmic electrodes for the light-emitting devices, the groove density cannot be overly high. In one embodiment, the surface area of a mesa is greater than 100×100 μm$^2$.

Since the InGaAlN material grown on a silicon substrate can be very thin and brittle, during device dicing, if the dicing blade approaches the substrate from the top side where the InGaAlN is grown, the dicing blade may come into contact with and damage the InGaAlN film. However, silicon is not transparent in the visible wavelength range. Hence, unlike sapphire substrates, it would be difficult to dice and crack the substrate from the backside of a silicon substrate. In one embodiment of the present invention, grooved sections corresponding to the device size are formed on the substrate prior to the fabrication of InGaAlN materials. This way, the dicing blade can move along the pre-formed groove to perform substrate dicing. In one embodiment, the groove width is greater than the blade thickness, which allows sufficient clearance between the blade and groove wall, prevents damages to the films, and allows complete devices to be obtained. According to the present invention, the electrodes of a device can be placed on the same side of the substrate, or can be placed in a vertical configuration. According to the present inventive method, the fabricated InGaAlN material can also be transferred to another silicon substrate or a substrate based on another material prior to fabrication of a light-emitting device.

In the figures, the same label and the associated object have the same meaning. Specifically, label "1" refers to a mesa, labels "2" and "2'" refer to the grooves, label "3" refers to the InGaAlN film, label "4" refers to a P-type electrode, label "5" refers to a dice groove, and label "6" refers to an N-type electrode.

The equipment involved in the present invention is commonly used in the industry, and therefore is not described in details in this disclosure.

The invention is illustrated with different embodiments, described in detail, and with examples for purposes of facilitating the implementation of the different features or components of the invention. However, it is not the intent of the inventors to limit the application of the invention to the details shown. Modification of the features or components of the invention can be made without deviating from the spirit of the invention and thus still remains within the scope of the claims.

EMBODIMENT EXAMPLES

Embodiment 1

Figure 1:
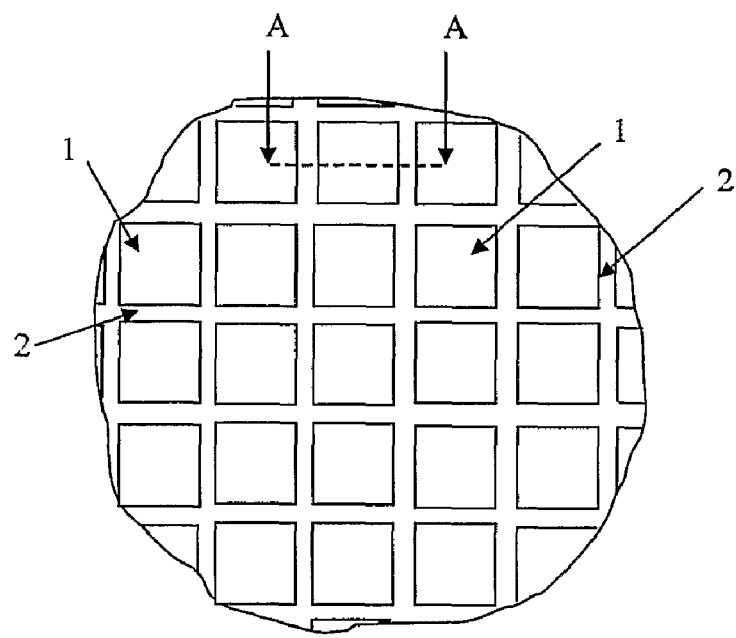
FIG. 1 illustrates part of a surface of a substrate which is etched with grooves.
Figure 2:
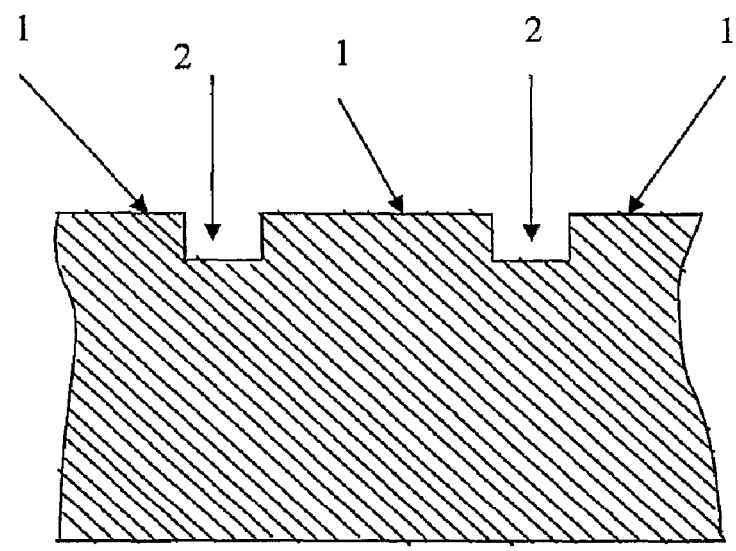
FIG. 2 presents a cross-sectional view in the A-A direction of the substrate illustrated in FIG. 1.
Figure 3:
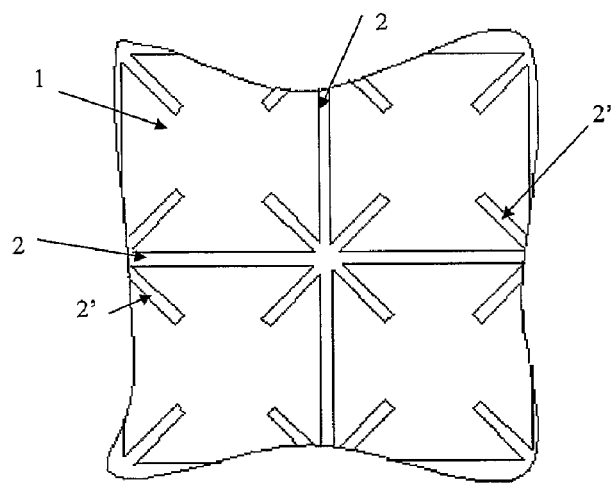
FIG. 3 illustrates a cross-sectional view of a silicon substrate on which InGaAlN films have been grown.
Figure 6:
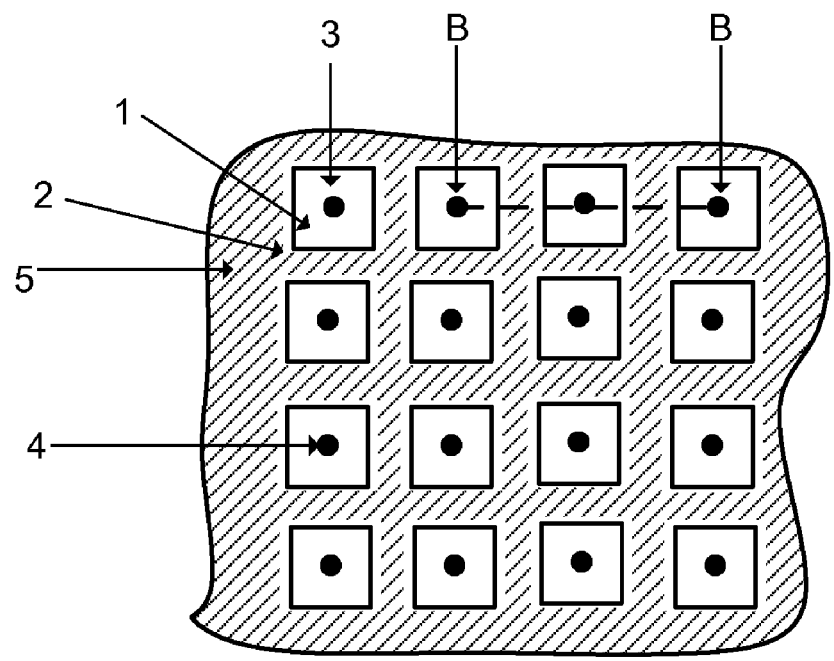
FIG. 6 illustrates the after-dice devices fabricated with the substrates illustrated in FIG. 1 and FIG. 3, with fabricated electrodes.
Figure 7:
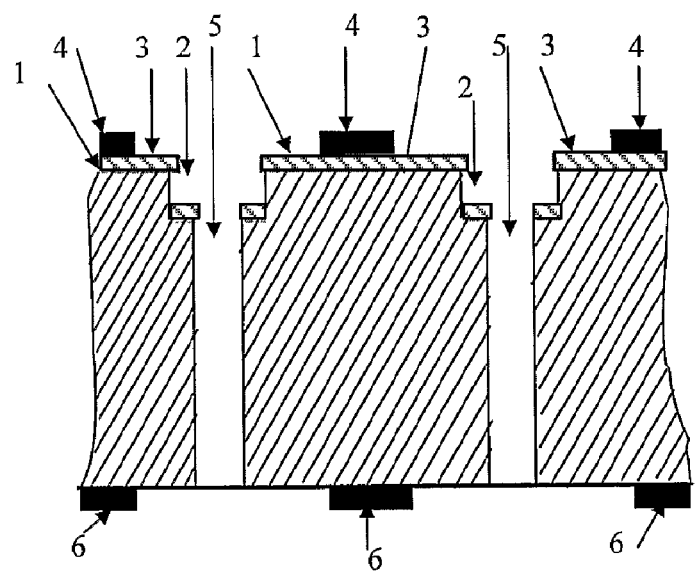
FIG. 7 illustrates a cross-sectional view in the B-B direction of the devices illustrated in FIG. 6.

A pattern as illustrated in FIG. 1 is etched on a (111) silicon substrate using regular photo lithography and plasma etching techniques. Square section 1 in FIG. 1 is an unetched mesa. Groove 2 is the result of the etching. FIG. 2 more clearly illustrates the structure of such a mesa and groove. In this embodiment, the distance between the centers of two neighboring square section is 100 μm. The groove width is 6 μm, and the groove depth is 6 μm. Subsequently, the patterned substrate is cleaned using well-known cleaning techniques for silicon substrates. The patterned substrate is then placed in a reaction chamber. An InGaAlN multi-layer structure required by a light-emitting device, including a buffer layer, N-type layer, light-emitting layer, and P-type layer, is deposited on the substrate surface. The multi-layer InGaAlN film 3 has a total thickness of 4 μm. After deposition, the cross section of the substrates has a structure as is illustrated in FIG. 3. By comparing FIG. 2 with FIG. 3, one can observe that InGaAlN materials are deposited both in the grooves and on the mesas. Since the groove depth is greater than the film thickness, the film grown inside a groove can remain disjoint from the film grown on a mesa. Furthermore, the film can also grow laterally towards the outside at the edges of a mesa. Since the grooves are sufficiently wide, the films grown laterally on neighboring mesas can remain disjoint. Since the films grown on all the mesas are independent from each other, the stress can be released and cracks would not appear on the mesas. After the film growth is complete, a P-type electrode 4 is fabricated on a respective mesa. An N-type electrode 6 is fabricated in a corresponding section on the back side of the substrate. Next, the substrate is diced along groove 2, and individual devices can be obtained, as illustrated in FIG. 6. FIG. 7 further presents the structure of a device after wafer dicing.

Embodiment 2

A pattern as illustrated in FIG. 1 is etched on a (111) silicon substrate using regular photo lithography and plasma etching techniques. Square section 1 in FIG. 1 is an unetched mesa. Groove 2 is the result of the etching. The cross-section structure of the substrate after grooves have been etched is shown in FIG. 2. In this embodiment, the distance between the centers of two neighboring square section is 3000 μm. The groove width is 50 μm, and the groove depth is 200 μm. Subsequently, the patterned substrate is cleaned using well-known cleaning techniques for silicon substrates. The patterned substrate is then placed in a reaction chamber. An InGaAlN multi-layer structure required by a light-emitting device, including a buffer layer, N-type layer, light-emitting layer, and P-type layer, is deposited on the substrate surface. The multi-layer InGaAlN film 3 has a total thickness of 4 μm. After deposition, the substrates has a cross-section structure as shown in FIG. 3. A smaller area on each mesa is etched using photo lithography and ICP etching, so that the N-type layer of InGaAlN multi-layer structure 3 is exposed in this area. An N-type electrode 6 is fabricated on the exposed N-type layer. A P-type electrode is fabricated on the unetched side of the mesa (P-type layer). Subsequently, the substrate is diced along groove 2, and separate device chips are obtained.

Embodiment 3

Figure 4:
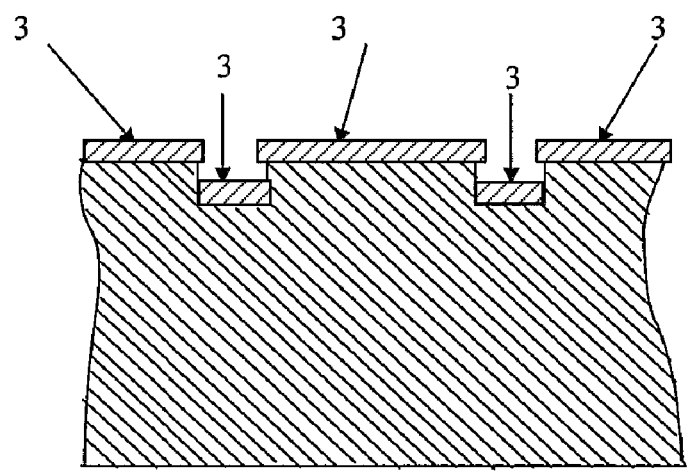
FIG. 4 illustrates a substrate surface with etched grooves in accordance with one embodiment of the present invention.

With reference to the figures, a triangular pattern as illustrated in FIG. 4 is etched on a (111) silicon substrate using regular photo lithography and plasma etching techniques. Section 1 in FIG. 4 is an unetched mesa. Groove 2 is the result of the etching. In this embodiment, each side of a triangle is 300 μm. The groove width is 20 μm, and the groove depth is 20 μm. Subsequently, the patterned substrate is cleaned using well-known cleaning techniques for silicon substrates. The patterned substrate is then placed in a reaction chamber. An InGaAlN multi-layer structure required by a light-emitting device, including a buffer layer, N-type layer, light-emitting layer, and P-type layer, is deposited on the substrate surface. The multi-layer InGaAlN film 3 has a total thickness of 4 μm. After the film is grown, a P-type electrode 4 is fabricated on each mesa. An N-type electrode 6 is fabricated in the corresponding section on the backside of the substrate. The substrate is diced along groove 2, and separate device chips are obtained.

Embodiment 4

Figure 5:
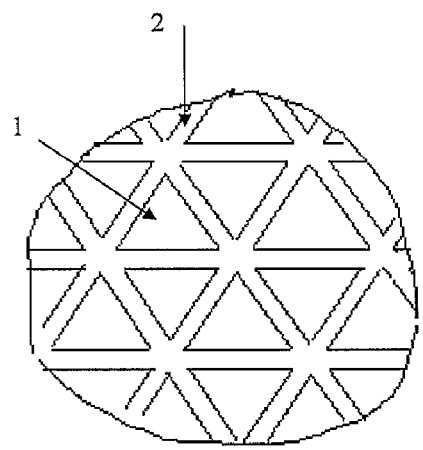
FIG. 5 illustrates a substrate surface with etched grooves in accordance with a further embodiment of the present invention.

With reference to the figures, a pattern as illustrated in FIG. 5 is etched on a (111) silicon substrate using regular photo lithography and plasma etching techniques. Section 1 is an unetched mesa. Area 2 and area 2' are etched groove regions. Grooves 2 are perpendicular to one another, and one of grooves 2' and one of grooves 2 for a 45° angle. Grooves 2 device the surface into square sections, wherein each side of a square section is 4000 μm. Grooves 2' further partially divide the grooves. The length of a single groove 2' is 1500 μm. The patterned substrate is cleaned using well-known cleaning techniques for silicon substrates. The patterned substrate is then placed in a reaction chamber. An InGaAlN multi-layer structure required by a light-emitting device, including a buffer layer, N-type layer, light-emitting layer, and P-type layer, is deposited on the substrate surface. The multi-layer InGaAlN film 3 has a total thickness of 3 μm. After the film is grown, a P-type electrode is fabricated on each mesa. An N-type electrode 6 is fabricated in each corresponding section on the backside of the substrate. The substrate is diced along groove 2, and separate device chips are obtained.

Embodiment 5

A pattern as illustrated in FIG. 1 is etched on a (111) silicon substrate using regular photo lithography and plasma etching techniques. Rectangular section 1 is an unetched mesa. Area is the etched groove region. The cross-section structure of the substrate after the grooves are etched is shown in FIG. 2. In this embodiment, each section is rectangular with a dimension of 500×400 μm. The width of the groove is 30 μm, and the depth of the groove is 300 μm. The patterned substrate is cleaned using well-known cleaning techniques for silicon substrates. The patterned substrate is then placed in a reaction chamber. An InGaAlN multi-layer structure required by a light-emitting device, including a buffer layer, N-type layer, light-emitting layer, and P-type layer, is deposited on the substrate surface. The multi-layer InGaAlN film 3 has a total thickness of 6 μm. After deposition, the substrate has a cross-section structure as shown in FIG. 3. A smaller area on each mesa is etched using photo lithography and ICP etching, so that the N-type layer of InGaAlN multi-layer structure 3 is exposed in this area. An N-type electrode 6 is fabricated on the exposed N-type layer. A P-type electrode is fabricated on the unetched side of the mesa (P-type layer). Subsequently, the substrate is diced along groove 2, and separate device chips are obtained.

What is claimed is:

1. A method for fabricating InGaAlN thin film on a silicon substrate, the method comprising:
    etching grooves on the silicon substrate, thereby creating a pattern with mesas of a predetermined shape;
    depositing InGaAlN semiconductor material on the silicon substrate; and
    obtaining crack-free InGaAlN structures on the mesas, wherein a groove has a depth not less than 6 μm; and
    wherein the InGaAlN structures on two adjacent mesas are disjoint.

2. The method of claim 1, wherein the depth of a groove is not less than 6 μm and not greater than 300 μm.

3. The method of claim 2, wherein the depth of the groove is not less than 10 μm and not greater than 30 μm.

4. The method of claim 1, wherein the width of a groove is greater than the total thickness of laterally grown thin films on the two adjacent mesas.

5. The method of claim 4, wherein the width of the groove is at least twice the total thickness of laterally grown thin films on the two adjacent mesas.

6. The method of claim 1, wherein the thickness of the groove is not less than 6 μm and not greater than 50 μm.

7. The method of claim 1, wherein the ratio of the perimeter to the area of a mesa is not less than 1 mm$^{-1}$ and not greater than 40 mm$^{-1}$.

8. The method of claim 7, wherein the ratio of the perimeter to the area of a mesa is not less than 4 mm$^{-1}$ and not greater than 20 mm$^{-1}$.

9. The method of claim 1, wherein the shape of the mesa is a circle, triangle, square, rectangular, or polygon.

10. The method of claim 1, wherein the area of a mesa is not less than 100×100 μm$^2$ and not greater than 3000×3000 μm$^2$.

11. The method of claim 10, wherein the area of a mesa is not less than 200×200 μm$^2$ and not greater than 1000×1000 μm$^2$.

12. The method of claim 1, further comprising:
fabricating an electrode on the InGaAlN structure; and
dicing the substrate, thereby separating the InGaAlN structures.

13. An InGaAlN light emitting device manufactured by a method for fabricating InGaAlN thin film on a silicon substrate, the method comprising:
etching grooves on the silicon substrate, thereby creating a pattern with mesas of a predetermined shape;
depositing InGaAlN semiconductor material on the silicon substrate; and
obtaining crack-free InGaAlN structures on the mesas, wherein a groove has a depth not less than 6 μm; and
wherein the InGaAlN structures on two adjacent mesas are disjoint.

14. The InGaAlN light emitting device of claim 13, wherein the depth of a groove is not less than 6 μm and not greater than 300 μm.

15. The InGaAlN light emitting device of claim 14, wherein the depth of the groove is not less than 10 μm and not greater than 30 μm.

16. The InGaAlN light emitting device of claim 13, wherein the width of a groove is greater than the total thickness of laterally grown thin films on the two adjacent mesas.

17. The InGaAlN light emitting device of claim 16, wherein the width of the groove is at least twice the total thickness of laterally grown thin films on the two adjacent mesas.

18. The InGaAlN light emitting device of claim 13, wherein the thickness of the groove is not less than 6 μm and not greater than 50 μm.

19. The InGaAlN light emitting device of claim 13, wherein the ratio of the perimeter to the area of a mesa is not less than 1 mm$^{-1}$ mm and not greater than 40 mm$^{-1}$.

20. The InGaAlN light emitting device of claim 19, wherein the ratio of the perimeter to the area of a mesa is not less than 4 mm$^{-1}$ and not greater than 20 mm$^{-1}$.

21. The InGaAlN light emitting device of claim 13, wherein the shape of the mesa is a circle, triangle, square, rectangular, or polygon.

22. The InGaAlN light emitting device of claim 13, wherein the area of a mesa is not less than 100×100 μm$^2$ and not greater than 3000×3000 μm$^2$.

23. The InGaAlN light emitting device of claim 22, wherein the area of a mesa is not less than 200×200 μm$^2$ and not greater than 1000×1000 μm$^2$.

24. The InGaAlN light emitting device of claim 13, wherein the method further comprising:
fabricating an electrode on the InGaAlN structure; and
dicing the substrate, thereby separating the InGaAlN structures.

* * * * *